(12) United States Patent
Chien et al.

(10) Patent No.: US 11,977,756 B2
(45) Date of Patent: May 7, 2024

(54) COMPUTER DEVICE, SETTING METHOD FOR MEMORY MODULE, AND MAINBOARD

(71) Applicant: GIGA-BYTE TECHNOLOGY CO., LTD., New Taipei (TW)

(72) Inventors: Chia-Chih Chien, New Taipei (TW); Sheng-Liang Kao, New Taipei (TW); Chen-Shun Chen, New Taipei (TW); Chieh-Fu Chung, New Taipei (TW); Hua-Yi Wu, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 160 days.

(21) Appl. No.: 17/695,861

(22) Filed: Mar. 16, 2022

(65) Prior Publication Data

US 2023/0214141 A1 Jul. 6, 2023

(30) Foreign Application Priority Data

Dec. 30, 2021 (TW) ................. 110149522

(51) Int. Cl.
*G06F 3/06* (2006.01)
*G06F 9/44* (2018.01)
*G06F 9/4401* (2018.01)

(52) U.S. Cl.
CPC .......... *G06F 3/0634* (2013.01); *G06F 3/0611* (2013.01); *G06F 3/0673* (2013.01); *G06F 9/4401* (2013.01)

(58) Field of Classification Search
CPC .... G06F 3/0634; G06F 3/0611; G06F 3/0673; G06F 9/4401
(Continued)

(56) References Cited

U.S. PATENT DOCUMENTS

| 7,707,369 | B2* | 4/2010 | Nulkar | G06F 3/0632 |
| | | | | 711/170 |
| 8,006,062 | B1* | 8/2011 | Cheng | G06F 9/4401 |
| | | | | 711/170 |

(Continued)

FOREIGN PATENT DOCUMENTS

| CN | 111381964 | 7/2020 |
| TW | 201610850 | 3/2016 |

(Continued)

OTHER PUBLICATIONS

"Office Action of Taiwan Counterpart Application", dated Sep. 29, 2022, p. 1-p. 8.

*Primary Examiner* — Christopher B Shin
(74) *Attorney, Agent, or Firm* — JCIPRNET (57) ABSTRACT

A computer device, a setting method for a memory module, and a mainboard are provided. The computer device includes a memory module, a processor, and the mainboard. A basic input output system (BIOS) of the mainboard stores a custom extreme memory profile (XMP). When the processor executes the BIOS, so that the computer device displays a user interface (UI), the BIOS displays multiple default XMPs stored in the memory module and the custom XMP through the UI. The BIOS stores one of the default XMPs and the custom XMP to the memory module according to a selecting result of the one of the default XMPs and the custom XMP displayed on the UI.

18 Claims, 5 Drawing Sheets

(58) Field of Classification Search
USPC .......................................................... 711/105
See application file for complete search history.

(56) References Cited

U.S. PATENT DOCUMENTS

| | | | | |
|---|---|---|---|---|
| 8,225,031 | B2* | 7/2012 | Lee .......................... | G11C 5/04 |
| | | | | 365/233.13 |
| 8,312,444 | B2* | 11/2012 | Von Khurja ............ | G06F 8/654 |
| | | | | 717/173 |
| 10,235,259 | B2* | 3/2019 | Chen ....................... | G06F 11/24 |
| 2004/0034755 | A1* | 2/2004 | LaBerge ............. | G06F 13/4243 |
| | | | | 711/167 |
| 2008/0162867 | A1* | 7/2008 | Shin ...................... | G06F 9/4401 |
| | | | | 711/E12.001 |
| 2009/0030857 | A1 | 1/2009 | Horvitz et al. | |
| 2010/0275000 | A1* | 10/2010 | Huang .................. | G06F 9/4401 |
| | | | | 713/2 |
| 2016/0378095 | A1* | 12/2016 | Liu ........................ | G05B 19/19 |
| | | | | 700/170 |
| 2018/0188769 | A1* | 7/2018 | Chen ....................... | G06F 11/24 |
| 2018/0188770 | A1* | 7/2018 | Chen .................. | G06F 13/4234 |

FOREIGN PATENT DOCUMENTS

| | | |
|---|---|---|
| TW | I526847 | 3/2016 |
| TW | I635382 | 9/2018 |

* cited by examiner

COMPUTER DEVICE, SETTING METHOD FOR MEMORY MODULE, AND MAINBOARD

CROSS-REFERENCE TO RELATED APPLICATION

This application claims the priority benefit of Taiwan application serial no. 110149522, filed on Dec. 30, 2021. The entirety of the above-mentioned patent application is hereby incorporated by reference herein and made a part of this specification.

BACKGROUND

Technical Field

The disclosure relates to a computer device, a setting method, and a mainboard disposed in the computer device, and more particularly to a computer device capable of executing overclocking, a setting method for a memory module, and a mainboard.

Description of Related Art

A user may perform overclocking on the memory module in a computer device to improve the working performance of the computer device. Generally speaking, the memory setting parameters for overclocking are listed as an extreme memory profile (XMP) and stored in the memory module. The user may set various memory setting parameters in the XMP through the basic input output system (BIOS) in the computer device. However, the memory setting parameters are quite complicated, so the user cannot perform overclocking in a fast and convenient way.

SUMMARY

The disclosure provides a computer device capable of setting a memory module in a quick and convenient way to overclock the memory module.

The computer device of the disclosure includes a memory module, a processor, and a basic input output system (BIOS). The memory module has a serial presence detect (SPD) module. The processor is coupled to the memory module. The BIOS is coupled to the processor and stores a custom extreme memory profile (XMP). When the processor executes the BIOS, so that the computer device displays a user interface (UI), the BIOS reads multiple default XMPs stored in the SPD module of the memory module. Moreover, the BIOS displays the default XMPs and the custom XMP through the UI. The BIOS stores one of the default XMPs and the custom XMP to a custom storage space of the SPD module according to a selecting result of one of the default XMPs and the custom XMP displayed on the UI.

The embodiment of the disclosure further provides a setting method for a memory module. The setting method includes the following steps. A BIOS is executed by a processor to display a UI through a computer device. Multiple default XMPs stored in an SPD module of a memory module are read by the BIOS. The default XMPs and a custom XMP are displayed by the BIOS through the UI. One of the default XMPs and the custom XMP is stored by the BIOS to a custom storage space of the SPD module according to a selecting result of one of the default XMPs and the custom XMP displayed on the UI.

The embodiment of the disclosure further provides a mainboard. The mainboard is disposed in the computer device and includes a BIOS. The BIOS stores a custom XMP and is coupled to a memory module and a processor disposed on the mainboard. When the processor executes the BIOS, so that the computer device displays a UI, the BIOS reads multiple default XMPs stored in the SPD module of the memory module and displays the default XMPs and the custom XMP through the UI. The BIOS stores one of the default XMPs and the custom XMP to a custom storage space of the SPD module according to a selecting result of one of the default XMPs and the custom XMP displayed on the UI.

Based on the above, the computer device, the setting method for the memory module, and the mainboard of the embodiments of the disclosure can write the default XMPs or the custom XMP to the memory module through the UI. Therefore, the user can achieve overclocking of the memory module through the UI in a fast and convenient way.

DESCRIPTION OF THE EMBODIMENTS

Some embodiments of the disclosure accompanied with drawings are described in detail as follows. For the reference numerals used in the following description, elements with the same reference numerals in different drawings are regarded as the same or similar elements. These embodiments are only a part of the disclosure and do not disclose all the possible implementations of the disclosure. To be more precise, the embodiments are only examples in the scope of the claims of the disclosure.

Figure 1:
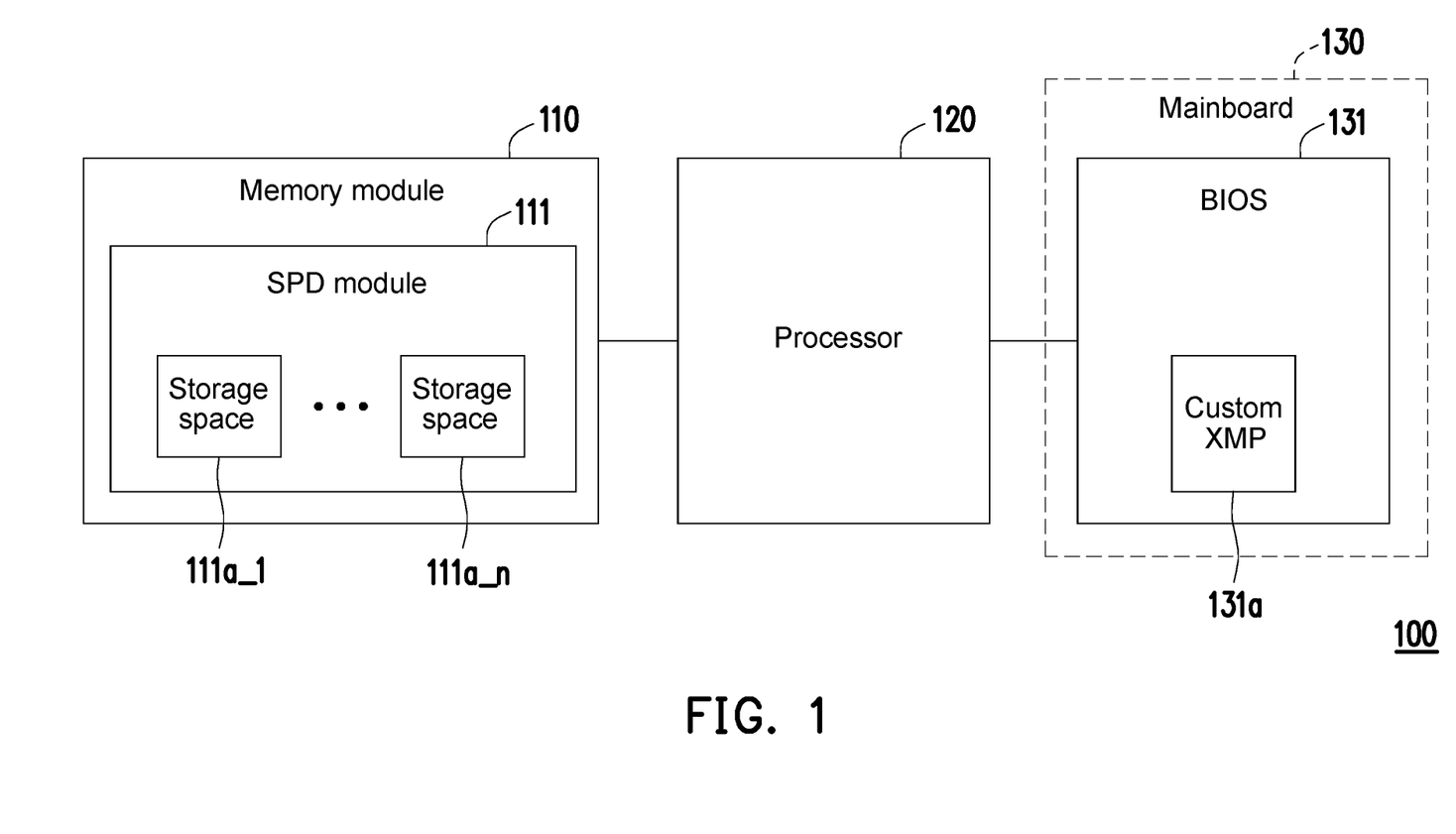
FIG. 1 is a schematic diagram of a computer device according to an embodiment of the disclosure.

FIG. 1 is a schematic diagram of a computer device according to an embodiment of the disclosure. Please refer to FIG. 1. A computer device 100 includes a memory module 110, a processor 120, and a mainboard 130. In the embodiment, the computer device 100 is applied to a computer operating system. The mainboard 130 has a memory socket and a central processing unit (CPU) socket for disposition of the memory module 110 and the processor 120, respectively.

In the embodiment, the memory module 110 is coupled to the processor 120, and has a serial presence detect (SPD) module 111. The SPD module 111 has multiple storage spaces $111a\_1$ to $111a\_n$. The number of the storage spaces $111a\_1$ to $111a\_n$ in the embodiment is only an example and is not limited thereto. The storage spaces $111a\_1$ to $111a\_n$ may store a basic memory profile and multiple default extreme memory profiles (XMPs), respectively. In the embodiment, the basic memory profile is set by the manufacturer producing the memory module 110. The basic memory profile has multiple memory setting parameters corresponding to the basic performance. The processor 120 can operate the memory module 110 according to the basic memory profile, so that the computer device 100 operates with the basic performance. In the embodiment, the default XMPs are the memory profiles stored in the SPD module 111. The default XMPs have multiple memory setting parameters corresponding to performances higher than the basic performance to perform overclocking on the memory module 110. The processor 120 can operate the memory module 110 according to the default XMPs, so that the computer device 100 operates with higher performance.

In the embodiment, the mainboard 130 further includes a basic input output system (BIOS) 131. The BIOS 131 is coupled to the processor 120. In the embodiment, the BIOS 131 stores a custom XMP 131a. In the embodiment, the custom XMP 131a is set by the manufacturer producing the mainboard 130. The custom XMP 131a has multiple memory setting parameters corresponding to performances higher than the basic performance to perform overclocking on the memory module 110. The processor 120 can operate the memory module 110 according to the custom XMP 131a, so that the computer device 100 operates with higher performance. It should be noted that the number of the custom XMP 131a may be greater than one. Different custom XMPs 131a have multiple memory setting parameters corresponding to different memory particles (chips) to overclock the corresponding memory modules 110, respectively.

In the embodiment, the mainboard 130 further includes a storage device. The storage device may be a flash memory and may store the BIOS 131. In the embodiment, the BIOS 131 is embedded in the computer device 100a in the form of firmware.

In the embodiment, the computer device 100 may be a device having a computing function such as a personal computer, a notebook computer, a tablet computer, etc., In the embodiment, the processor 120 may be a central processing unit (CPU).

In the embodiment, the memory module 110 may be a dynamic random access memory (DRAM), for example, a synchronous dynamic random access memory (SDRAM). It should be noted that in the embodiment, the memory module 110 is a double data rate 5 synchronous dynamic random access memory (DDRS SDRAM). Therefore, two of the storage spaces 111a_1 to 111a_n of the SPD module 111 are, for example, storage spaces 111a_4 and 111a_5. When the memory module 110 is shipped from the factory, no XMP has been stored yet, and space is reserved to store the XMP customized by a user.

Figure 2:
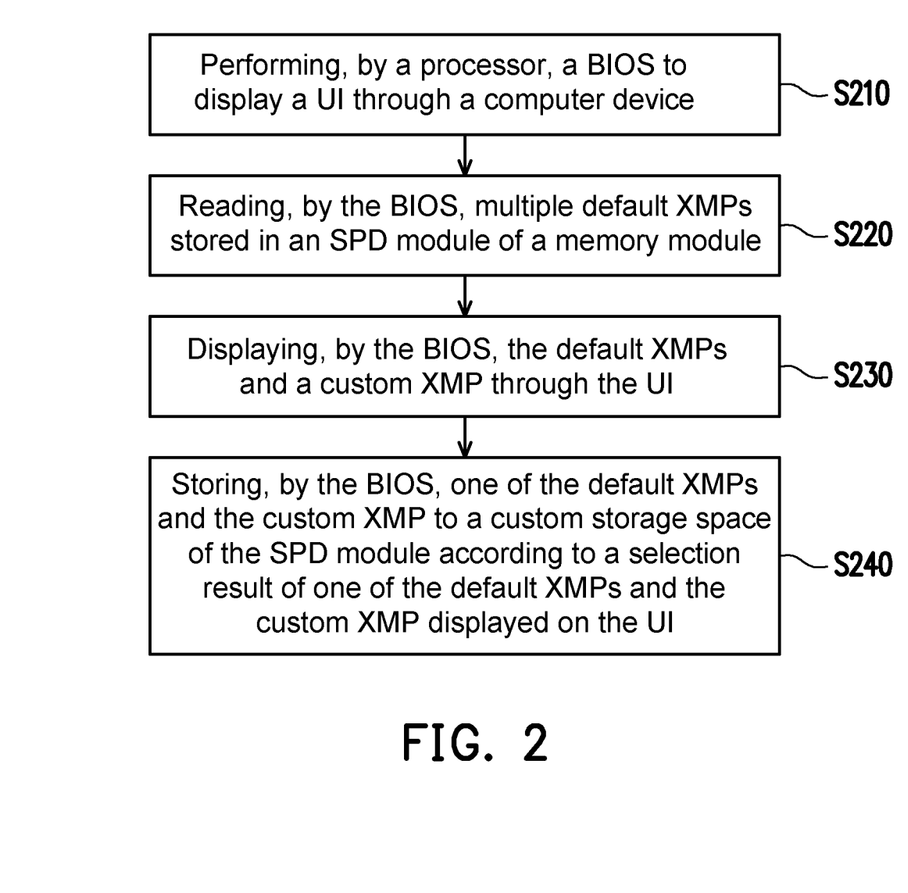
FIG. 2 is a flowchart of a setting method for a memory module according to an embodiment of the disclosure.

FIG. 2 is a flowchart of a setting method for a memory module according to an embodiment of the disclosure. Please refer to FIGS. 1 and 2. The computer device 100 may execute the following steps S210 to S240 to set the memory module 110. After the computer device 100 is booted, the user may enter the BIOS 131 through a shortcut key of the computer device 100. In step S210, the processor 120 executes the BIOS 131 to display a user interface (UI) through the computer device 100. In the embodiment, the display of the computer device 100 may display the UI. The user may operate the BIOS 131 through the UI to set the memory setting parameters for operating the memory module 110.

In step S220, the BIOS 131 reads multiple default XMPs stored in the SPD module 111 of the memory module 110. In the embodiment, the BIOS 131 may further read the basic memory profile and the current memory profile stored in the SPD module 111. The current memory profile is the memory profile related to the operation of the memory module 110 when the computer device 100 is booted the previous time.

In step S230, the BIOS 131 displays the default XMPs and the custom XMP through the UI. In some embodiments, the BIOS 131 further displays the basic memory profile and the current memory profile through the UI. It should be noted that the default XMPs, the basic memory profile, and the current memory profile are stored in the memory module 110, and the custom XMP is stored in the BIOS 131. Therefore, the UI can display multiple memory profiles stored in different storage spaces.

In step S240, the BIOS 131 stores one of the default XMPs and the custom XMP to a custom storage space in the SPD module 111 according to a selecting result of one of the default XMPs and the custom XMP displayed on the UI. In other words, the user selects the default XMP or the custom XMP through the UI. The user stores the selected XMP to the SPD module 111 through the UI. In the embodiment, the custom storage space is at least one of the storage spaces 111a_1 to 111a_n. It should be noted that the memory module 110 applied to the DDRS SDRAM has specific storage spaces 111a_4 and 111a_5 to store the XMPs not provided by the manufacturer of the memory module 110.

It is worth mentioning here that the user can browse and select the required XMP (the default XMP or the custom XMP) through the UI, and write the selected XMP to the SPD module 111 of the memory module 110 through the UI to achieve overclocking of the memory module 110. In this way, the user does not need to know the addresses where the various XMPs are actually stored, and also does not need to repeatedly self-adjust the contents of the XMPs. Therefore, the computer device 100 provides a fast and convenient way to perform overclocking.

Figure 3:
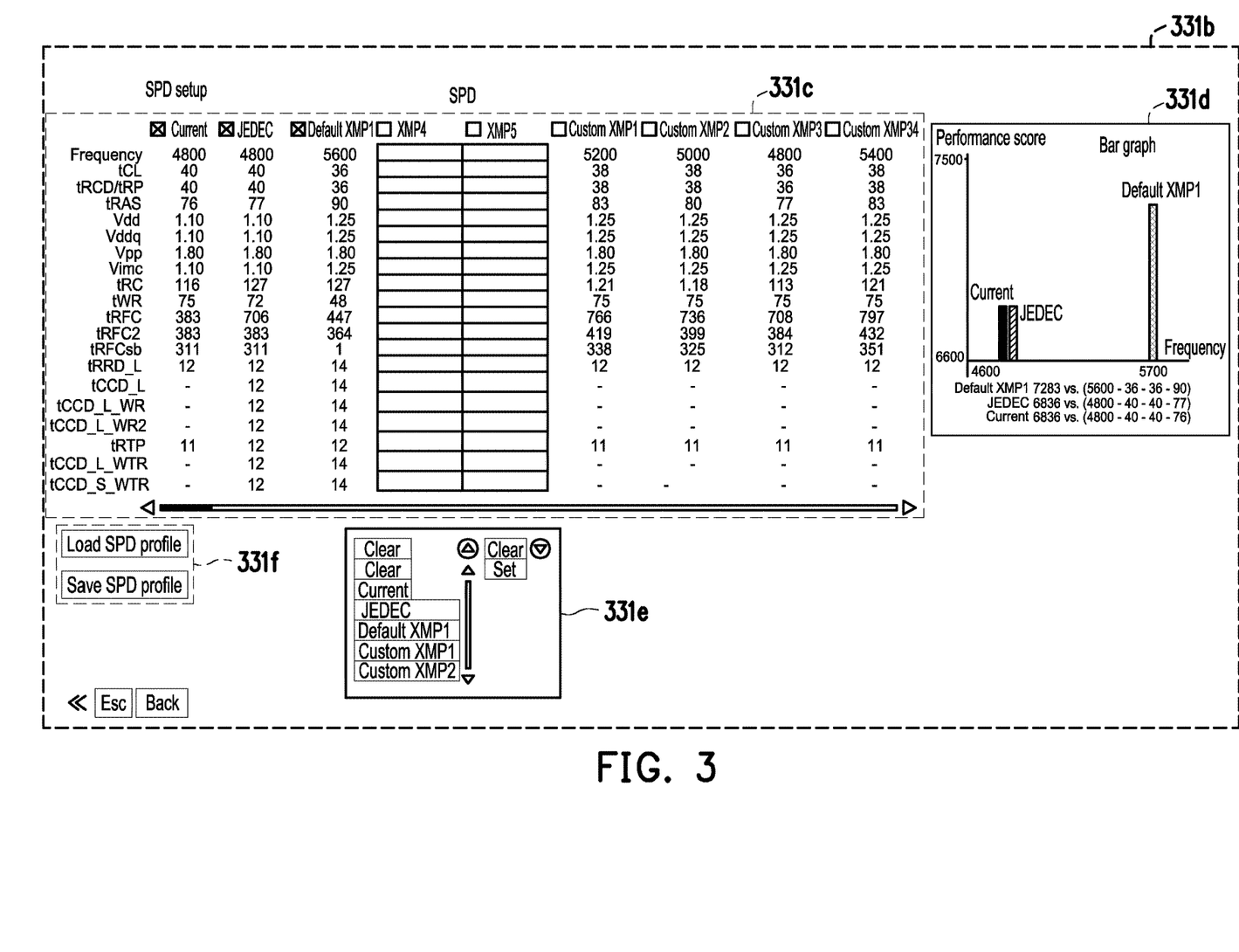
FIG. 3 is a schematic diagram of a UI according to an embodiment of the disclosure.

FIG. 3 is a schematic diagram of a UI according to an embodiment of the disclosure. Please refer to FIGS. 1 and 3. When executing the BIOS 131, the computer device 100 displays a UI 331b through the display, so that the user may operate the BIOS 131 through the UI 331b.

In the embodiment, the UI 331b displays the contents of multiple memory profiles, and the contents of the memory profiles are displayed through a tabular window 331c. In the embodiment, the horizontal axis of the window 331c is the file name of the memory profile. The vertical axis of the window 331c is the data item included in the memory profile.

For example, as shown in FIG. 3, the window 331c displays the contents of the current memory profile, the basic memory profile, multiple default XMPs, and multiple custom XMPs. In the window 331c, the file names of the current memory profile and the basic memory profile are represented by the names "Current" and "JEDEC", respectively. The file names of the default XMPs are represented by the names "Default XMP1", "XMP4", and "XMP5". It should be noted that the default XMPs indicated by "XMP4" and "XMP5" are blank, meaning that no values have been stored in the storage spaces 111a_4 and 111a_5 of the SPD module 111 yet. In the embodiment, the file names of the custom XMPs are represented by the names "Custom XMP1", "Custom XMP2", "Custom XMP3", and "Custom XMP4". It should be noted that any of the custom XMPs ("Custom XMP1" to "Custom XMP4") may be written to the storage spaces 111a_4 and 111a_5 (that is, "XMP4" or "XMP5") of the SPD module 111. The number and arrangement of various memory profiles in the embodiment are only examples and are not limited thereto.

In the embodiment, the data items of various memory profiles displayed in the window 331c of the UI 331b are memory setting parameters. In the embodiment, the memory setting parameters include the operating frequency of the memory module 110 (indicated by "Frequency"), a column address strobe or signal (CAS) latency (indicated by "tCL"), an SDRAM row address strobe (RAS) to CAS delay time/SDRAM row precharge delay time (indicated by "tRCD/tRP"), an SDRAM active to precharge delay time (indicated by "tRAS"), an SDRAM nominal voltage of the core power supply (indicated by "Vdd"), an SDRAM nominal voltage of the input and output buffer power supply (indicated by "Vddq"), a SDRAM nominal voltage of the maximum word line voltage peak (indicated by "Vpp"), a memory controller voltage (indicated by "Vimc"), an SDRAM active to active/refresh delay time (indicated by "tRC"), an SDRAM write recovery time (indicated by "tWR"), multiple SDRAM refresh recovery delay time (indicated by "tRFC" and "tRFC2"), a same bank refresh command (REFsb) delay time (indicated by "tRFCsb"), a row to row delay-long (indicated by "tRRD_L"), a column to column delay-long (indicated by "tCCD_L"), multiple column to column delay_ long write to write delay time write recovery (indicated by "tCCD_L_WR" and "tCCD_L_WR2"), an SDRAM read to precharge command delay time on the same memory rank (indicated by "tRTP"), a column to column delay-long write to read delay time on the same memory rank (indicated by "tCCD_L WTR"), and a column to column delay-short write to read delay time on the same memory rank (indicated by "tCCD_S_WTR"). In the embodiment, the memory setting parameters related to the operating voltage of the memory module 110 include the SDRAM nominal voltage of the core power supply, the SDRAM nominal voltage of the input and output buffer power supply, the SDRAM nominal voltage of the maximum word line voltage peak, and the memory controller voltage.

In the embodiment, the UI 331b further displays multiple performance scores corresponding to various memory profiles. In the embodiment, the BIOS 131 calculates the corresponding performance scores according to a part of or all of the respective memory setting parameters of the current memory profile, the basic memory profile, the default XMPs, and the custom XMP. The performance scores are positively related to the performances generated by the processor 120 operating the memory module 110 according to the corresponding various memory profiles.

In the embodiment, the UI 331b further displays the performance score and the corresponding operating frequency through a graph 331d. It should be noted that the user may select part of the memory profiles through the window 331c to display the corresponding performance score and the corresponding operating frequency. For example, the graph 331d is represented by a bar chart. The horizontal axis of the graph 331d is the operating frequency in the memory setting parameters. The vertical axis of the graph 331d is the performance score. As shown in FIG. 3, the current memory profile, the basic memory profile, and a first default XMP (that is, "Default XMP1") are checked. Therefore, the UI 331b displays the performance scores and the corresponding operating frequencies of the current memory profile, the basic memory profile, and the first default XMP through multiple bars of the bar chart.

In the embodiment, the UI 331b further displays operation icons for executing settings through the window 331e, so that the user may set the contents of various memory profiles in the window 331c. Specifically, the UI 331b selects a custom XMP through the window 331c or the window 331e to delete or modify the file name and/or the memory setting parameters in the selected custom XMP. The UI 331b may delete the selected content through "Clear" icon of the window 331e. The UI 331b may modify the selected content through "Set" icon of the window 331e. Therefore, the BIOS 131 obtains the modified file name and the corresponding memory setting parameters of the custom XMP according to multiple parameter input operations (that is, "Clear" and/or "Set" icons) of the UI 331b.

In the embodiment, the UI 331b further uses "Load SPD profile" icon in a window 331f to directly write the custom XMP stored in the BIOS 131 to the SPD module 111. Therefore, the BIOS 131 obtains the memory setting parameters of the custom XMP pre-stored in the BIOS 131 according to the file loading operation (that is, "Load SPD profile" icon) of the UI 331b. Next, the UI 331b may further display the loaded custom XMP through the window 331c. For example, the BIOS 131 overwrites a second default XMP (that is, "XMP4" represented by a blank table) shown in FIG. 3 as the content of the loaded custom XMP.

In the embodiment, the UI 331b further stores the above-mentioned settings related to the operation of the BIOS 131 through "Save SPD profile" icon in the window 331f.

Figure 4:
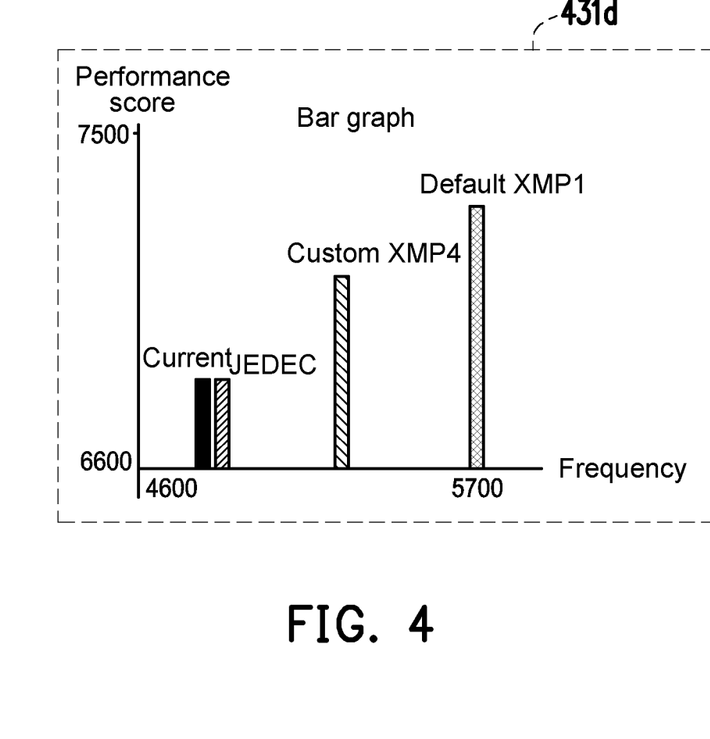
FIG. 4 is a schematic diagram of a UI according to another embodiment of the disclosure.

FIG. 4 is a schematic diagram of a UI according to another embodiment of the disclosure. Please refer to FIGS. 3 and 4. A graph 431d is another implementation of the graph 331d. It is supposed that the user selects the current memory profile, the basic memory profile, the first default XMP (that is, "Default XMP1"), and a fourth custom XMP (that is, "Custom XMP4") through the UI 331b, multiple bars of the graph 431d display the performance scores and the corresponding operating frequencies corresponding to the various memory profiles. It should be noted that in the graph 431d, the bars may be displayed in different colors, and the colors displayed by the bars are determined according to the corresponding performance scores, respectively. For example, the higher the performance score, the higher the grayscale value of the corresponding color.

Figure 5:
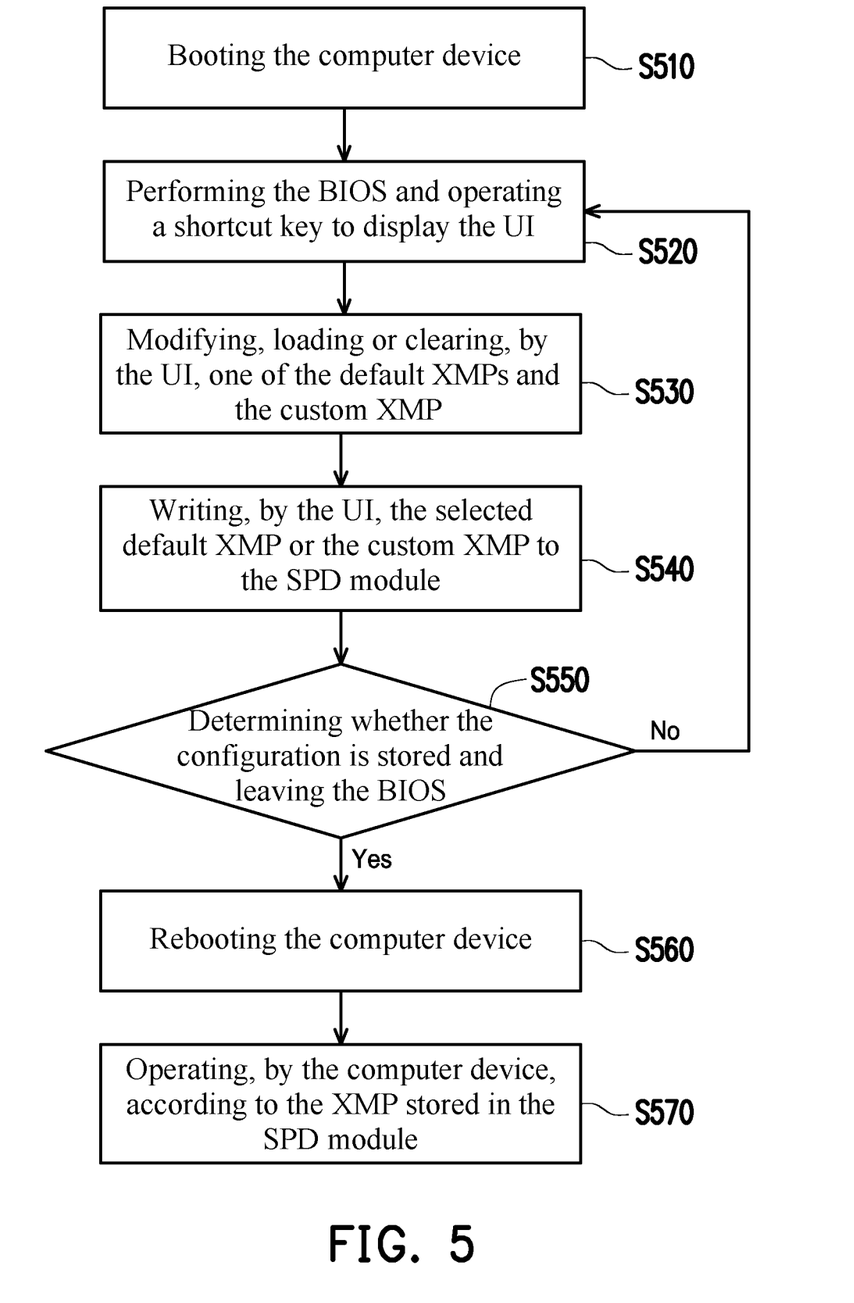
FIG. 5 is a flowchart of a setting method for a memory module according to another embodiment of the disclosure.

FIG. 5 is a flowchart of a setting method for a memory module according to another embodiment of the disclosure. Please refer to FIGS. 1 and 5. The computer device 100 may execute the following steps S510 to S570 to set the memory module 110. Moreover, the computer device 100 operates the memory module 110 according to the set custom XMP. In step S510, the user turns on the computer device 100 to boot the computer device 100. In step S520, the processor 120 executes the BIOS 131, a shortcut key of the computer device 100 is operated to display the UI corresponding to the BIOS 131. In the embodiment, the user may operate the BIOS 131 through the UI to set the memory setting parameters for operating the memory module 110.

In the embodiment, the UI displays the contents and the corresponding performance scores of the current memory profile, the basic memory profile, the default XMPs, and the custom XMP through multiple windows and graphs. In step S530, one of the default XMPs and the custom XMP is modified, loaded, or cleared through the UI, so that one of the default XMPs and the custom XMP is operated. For example, in step S530, the custom XMP is operated by loading, so the custom XMP is selected through the UI. In step S540, the selected default XMP or the custom XMP is written to the SPD module 111 of the memory module 110 through the UI. The written default XMP or custom XMP is configured as the latest default memory profile in the memory module 110, so that the computer device 100 operates according to the memory profile when being booted the next time.

In step S550, the BIOS 131 judges whether the settings related to the operation of the BIOS 131 have been stored and whether leaving the BIOS 131 is requested. In the embodiment, the BIOS 131 judges whether the settings related to the operation of the BIOS 131 have been stored and whether the user requests to finish executing the BIOS 131 according to the response of "Save SPD profile" icon in the window.

If the response is no, it means that the current settings for the operation of the BIOS 131 have not been completed. The computer device 100 starts executing from step S520 again. In other words, the processor 120 continues to execute the BIOS 131, and the UI continues to operate the BIOS 131.

If the response is yes, it means that the current settings for the operation of the BIOS 131 have been completed, and the processor 120 finishes executing the BIOS 131. Therefore, in step S560, the user restarts the computer device 100 or the computer device 100 restarts itself to reboot the computer device 100. In step S570, the computer device 100 operates according to the XMP (that is, the latest default memory profile stored in step S540) stored in the SPD module 111, so that the computer device 100 operates with a performance higher than the basic performance.

In summary, the computer device, the setting method for the memory module, and the mainboard of the embodiments of the disclosure can operate the BIOS through the UI, and write the custom XMP stored in the BIOS to the SPD module of the memory module. In some embodiments, the BIOS can modify or delete part of the memory setting parameters of the custom XMP through the UI. In some embodiments, the BIOS can browse the performance scores and the corresponding operating frequencies of the default XMP and the custom XMP through the UI. Therefore, the user can achieve overclocking of the memory module through the UI in a fast and convenient way.

Although the disclosure has been described with reference to the above embodiments, the described embodiments are not intended to limit the disclosure. People of ordinary skill in the art may make some changes and modifications without departing from the spirit and the scope of the disclosure. Thus, the scope of the disclosure shall be subject to those defined by the attached claims.

What is claimed is:

1. A computer device, comprising:
   a memory module, having a serial presence detect (SPD) module;
   a processor, coupled to the memory module; and
   a basic input output system (BIOS), coupled to the processor and storing a custom extreme memory profile (XMP), wherein
   when the processor executes the BIOS, so that the computer device displays a user interface (UI), the BIOS reads a plurality of default XMPs stored in the SPD module of the memory module, and the BIOS displays the plurality of default XMPs and the custom XMP through the UI, wherein
   the BIOS stores one of the plurality of default XMPs and the custom XMP to a custom storage space of the SPD module according to a selecting result of the one of the plurality of default XMPs and the custom XMP displayed on the UI,
   wherein the UI displays a plurality of memory setting parameters of the plurality of default XMPs and the customer XMP, respectively, and further displays a plurality of performance scores of the plurality of default XMPs and the custom XMP displayed corresponding to the UI.

2. The computer device according to claim 1, wherein the memory module is a double data rate 5 synchronous dynamic random access memory (DDR5 SDRAM) module.

3. The computer device according to claim 1, wherein the BIOS obtains the plurality of memory setting parameters of the custom XMP according to a plurality of parameter input operations of the UI.

4. The computer device according to claim 1, wherein the BIOS obtains the plurality of memory setting parameters of the custom XMP according to a file loading operation of the UI.

5. The computer device according to claim 1, wherein the BIOS calculates the plurality of performance scores according to a part of the plurality of memory setting parameters of the plurality of default XMPs and the custom XMP, respectively, and the plurality of performance scores and a plurality of corresponding operating frequencies are displayed through a plurality of bars of a bar chart.

6. The computer device according to claim 5, wherein a part of the plurality of memory setting parameters comprises at least one of a memory, a memory operating frequency, a column address strobe or signal (CAS) latency, an SDRAM row address strobe or signal (RAS) to CAS delay time, an SDRAM row precharge delay time, an SDRAM active to precharge delay time, and a memory operating voltage.

7. The computer device according to claim 5, wherein a plurality of colors displayed by the plurality of bars are determined according to the plurality of performance scores, respectively.

8. The computer device according to claim 1, wherein after the BIOS finishes storing one of the plurality of default XMPs and the custom XMP to the custom storage space of the SPD module of the memory module, the BIOS reboots the computer device, and the processor reads a plurality of memory setting parameters of the custom storage space stored in the SPD module through the BIOS to operate the memory module.

9. A setting method for a memory module, comprising:
   executing, by a processor, a basic input output system (BIOS) to display a user interface (UI) through a computer device;
   reading, by the BIOS, a plurality of default extreme memory profiles (XMPs) stored in a serial presence detect (SPD) module of a memory module;
   displaying, by the BIOS, the plurality of default XMPs and a custom XMP through the UI; and
   storing, by the BIOS, one of the plurality of default XMPs and the custom XMP to a custom storage space of the SPD module according to a selecting result of the one of the plurality of default XMPs and the custom XMP displayed on the UI,
   wherein the step of displaying the UI comprises:
   displaying, by the UI, a plurality of memory setting parameters of the default XMPs and the customer XMP, respectively, and further displaying a plurality of performance scores of the default XMPs and the custom XMP displayed corresponding to the UI.

10. The setting method for the memory module according to claim 9, wherein the memory module is a double data rate 5 synchronous dynamic random access memory (DDR5 SDRAM) module.

11. The setting method for the memory module according to claim 9, further comprising:
   obtaining, by the BIOS, the plurality of memory setting parameters of the custom XMP according to a plurality of parameter input operations of the UI.

12. The setting method for the memory module according to claim 9, further comprising:

obtaining, by the BIOS, the plurality of memory setting parameters of the custom XMP according to a file loading operation of the UI.

13. The setting method for the memory module according to claim 9, wherein the step of displaying the UI further comprises:

calculating, by the BIOS, the plurality of performance scores according to a part of the plurality of memory setting parameters of the plurality of default XMPs and the custom XMP, respectively; and displaying, through a plurality of bars of a bar chart in the UI, the plurality of performance scores and a plurality of corresponding operating frequencies.

14. The setting method for the memory module according to claim 13, wherein a part of the plurality of memory setting parameters comprises at least one of a memory particle type, a memory operating frequency, a column address strobe or signal (CAS) latency, an SDRAM row address strobe or signal (RAS) to CAS delay time, an SDRAM row precharge delay time, an SDRAM active to precharge delay time, and a memory operating voltage.

15. The setting method for the memory module according to claim 13, wherein a plurality of colors displayed by the plurality of bars are determined according to the plurality of performance scores, respectively.

16. The setting method for the memory module according to claim 9, further comprising:

rebooting, by the BIOS, the computer device after the BIOS finishes storing the one of the plurality of default XMPs and the custom XMP to the custom storage space of the SPD module of the memory module; and reading, by the processor, a plurality of memory setting parameters of the custom storage space stored in the SPD module through the BIOS to operate the memory module.

17. A mainboard, disposed in a computer device, comprising:

a basic input output system (BIOS), storing a custom extreme memory profile (XMP) and coupled to a memory module and a processor disposed on the mainboard, wherein when the processor executes the BIOS, so that the computer device displays a user interface (UI), the BIOS reads a plurality of default XMPs stored in a serial presence detect (SPD) module of the memory module, and the BIOS displays the plurality of default XMPs and the custom XMP through the UI, wherein the BIOS stores one of the plurality of default XMPs and the custom XMP to a custom storage space of the SPD module according to a selecting result of the one of the plurality of default XMPs and the custom XMP displayed on the UI, wherein the UI displays a plurality of memory setting parameters of the plurality of default XMPs and the customer XMP, respectively, and further displays a plurality of performance scores of the plurality of default XMPs and the custom XMP displayed corresponding to the UI.

18. The mainboard according to claim 17, wherein the memory module is a double data rate 5 synchronous dynamic random access memory (DDR5 SDRAM) module.

* * * * *